United States Patent [19]

Jullien

[11] Patent Number: 4,954,928
[45] Date of Patent: Sep. 4, 1990

[54] MEMORY CARTRIDGE FOR ELECTRONIC EQUIPMENT, AND ELECTRONIC EQUIPMENT PROVIDED WITH SUCH CARTRIDGES

[75] Inventor: Claude Jullien, Sartoux, France
[73] Assignee: La Telemecanique Electrique, France
[21] Appl. No.: 245,257
[22] Filed: Sep. 16, 1988
[30] Foreign Application Priority Data Sep. 18, 1987 [FR] France .................... 87 12974

[51] Int. Cl.⁵ ............................................. H05K 7/14
[52] U.S. Cl. ..................................... 361/391; 439/372
[58] Field of Search ............... 361/391; 312/320, 333; 439/372

[56] References Cited
U.S. PATENT DOCUMENTS 2,514,246 7/1950 Knox .................................... 361/391

Primary Examiner—Roy N. Envall, Jr.
Attorney, Agent, or Firm—William A. Drucker

[57] ABSTRACT

The invention relates to a removable memory cartridge for electronic equipment such as a programmable automaton, the cartridge being of the type comprising a box (101), a memory unit mounted in the box, an elongate connector fixed to the box, and grasping means provided on the box to enable the cartridge to be extracted by seaprating the connector. The grasping means comprise a flat member (110) hinged about an axis (114) lying at least approximately in the midplane of the connector, said flat member being suitable for occupying a first position against the box where it does not substantially increase the size thereof, and a second position away from the box in which it may be grasped in order to exert an extraction force on the box acting substantially level with the connector.

17 Claims, 2 Drawing Sheets

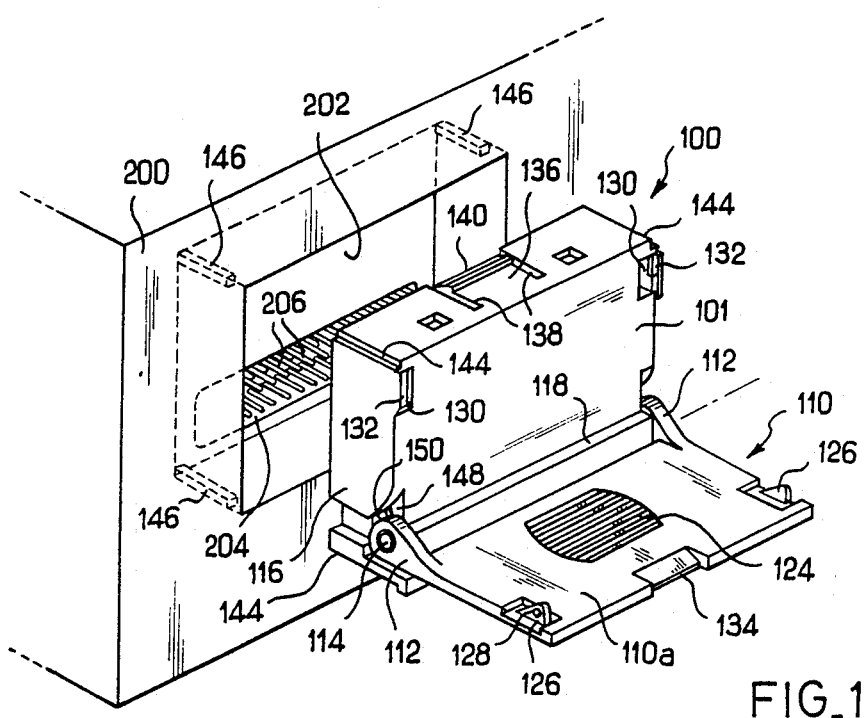
FIG_1
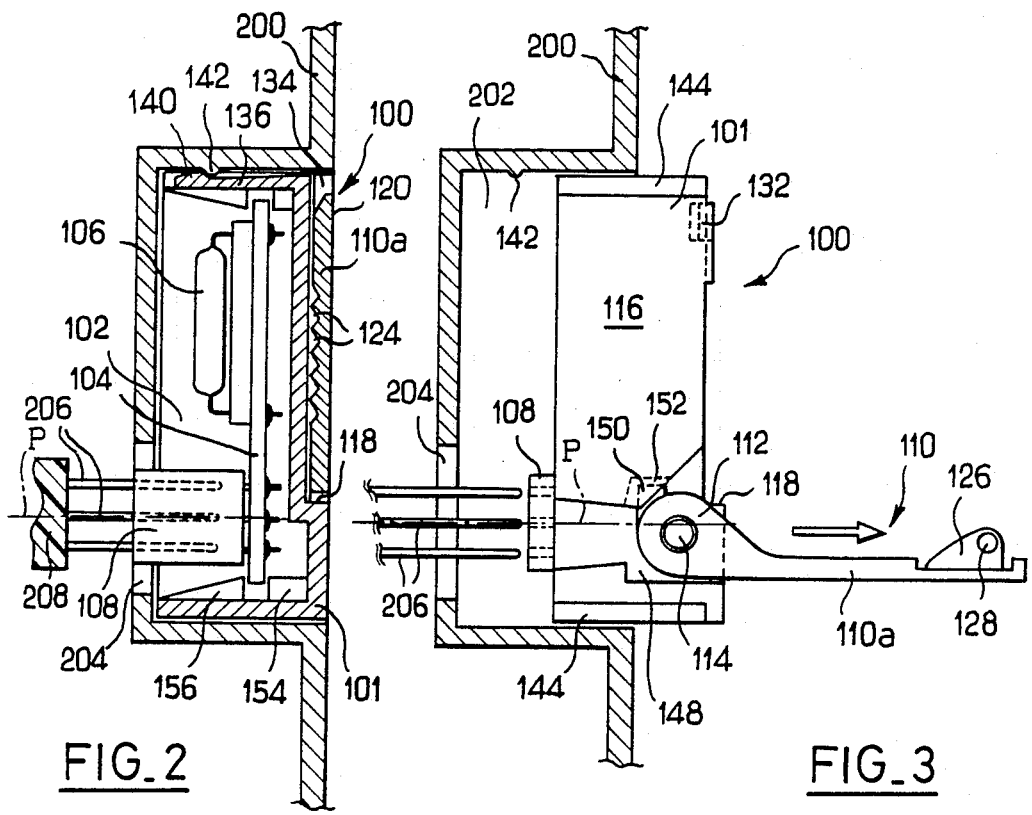
FIG_2   FIG_3

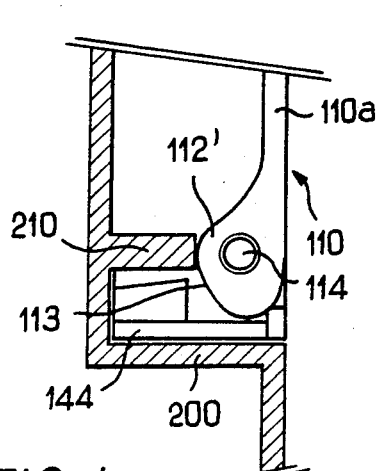
FIG_4a
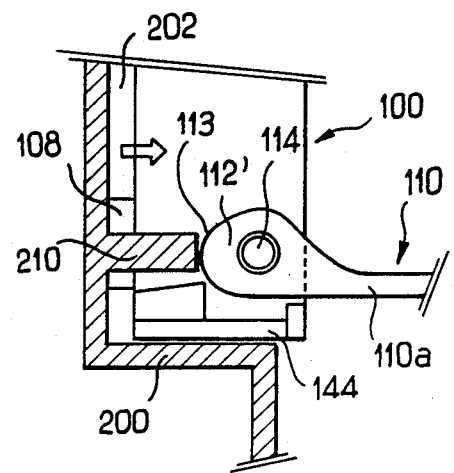
FIG_4b
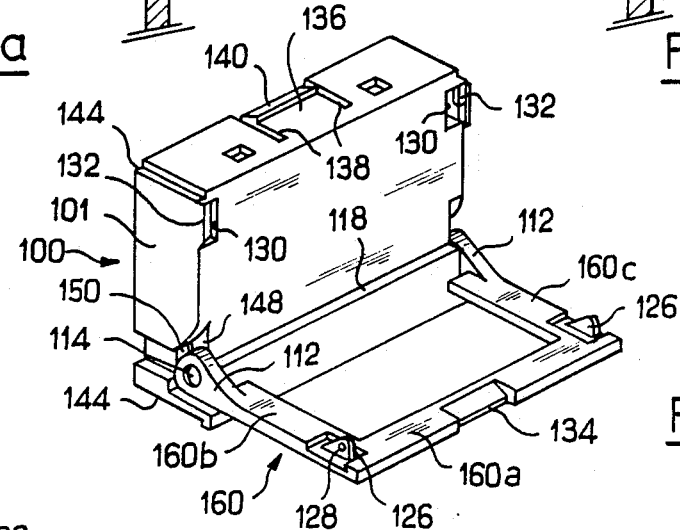
FIG_5
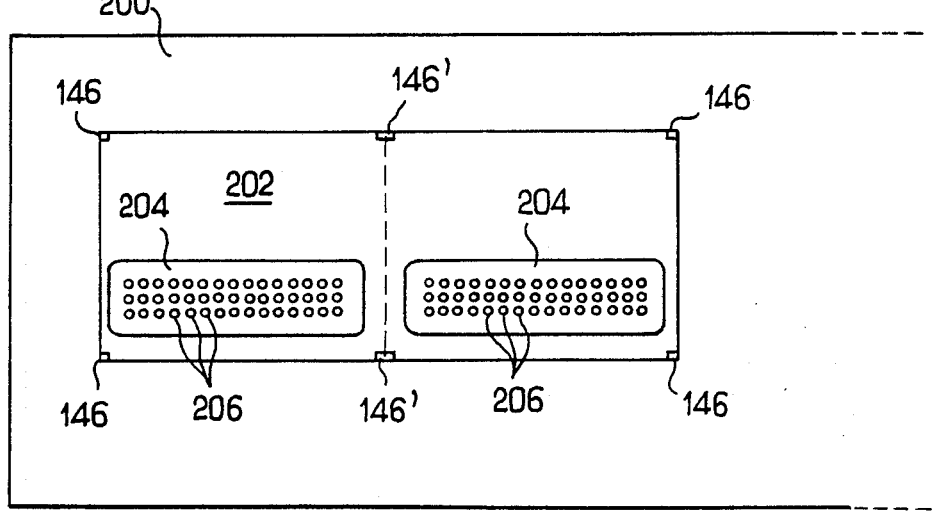
FIG_6

MEMORY CARTRIDGE FOR ELECTRONIC EQUIPMENT, AND ELECTRONIC EQUIPMENT PROVIDED WITH SUCH CARTRIDGES

The present invention relates in general to memory cartridges for electronic equipments such as programmable automatons, and it relates more particularly to a removable memory cartridge of the type comprising a box, a memory unit mounted in the box, and an elongate connector fixed to the box and enabling said memory unit to be interconnected with electronic equipment while simultaneously contributing to fixing the cartridge in an associated housing of the equipment, the box being provided with grasping means to enable the cartridge to be extracted by separating the connector.

BACKGROUND OF THE INVENTION

It is conventional for a programmable automaton to include one or more such cartridges. For example, a first cartridge may include a read only memory (ROM) containing a so-called "system" program, i.e. a program defining a special language for the programming instructions of the automaton, whereas a second cartridge includes a ROM containing a second so-called "user" program containing the set of instructions required for the process which the automaton is to perform and written in the language under consideration.

In a variant, the or each ROM may be replaced by a battery-backed read/write memory (RAM).

French patent specification number 2 502 357 describes a programmable automaton including a cartridge of the type described above.

The cartridge comprises an essentially rectangular box received in a housing in the front face of the automaton, together with two side tabs fixed to the box and projecting outwardly enabling the box to be grasped for extraction purposes so that the cartridge can be replaced.

However, a cartridge of this type suffers from various drawbacks.

Firstly, since the tabs occupy the entire height of the box, the operator's fingers can be placed in several different positions, and as a result the extraction force might be offset from the cartridge connector. Consequently, torque is set up giving rise to a substantial risk of jamming the cartridge in its housing by rotating it about an axis passing through the collector, and also running the risk of twisting the connector pins and thus making it unusable.

Further, another drawback of such a solution is to increase the size not only of the cartridge per se, but also to increase the empty space which must be reserved for it on the automaton. More precisely, not only must the grasping tabs be in front of the front face plane of the automaton, but also empty spaces must be left on either side of said tabs in order to receive the fingers.

One particular result is that it is possible to juxtapose two such prior art cartridges closely side-by-side, thus further increasing overall size.

In addition, French patent number 2 478 883 describes a system in which cartridge retaining and extracting means are provided on the unit which receives the cartridge instead of on the cartridge itself, said means including a complex mechanism which is frictionally associated with a hinged door.

U.S. Pat. No. US-A-3 140 905 describes an extraction system operating on a similar principle, and applied to the chassis of electronic apparatus.

However, these systems are complex, fragile, and expensive.

The present invention seeks to mitigate the drawbacks of the prior art and to provide a memory cartridge for equipment such as a programmable automaton, which cartridge includes extraction means for ensuring that the extraction force is always exerted level with the collector, and which simultaneously occupies a minimum amount of source in depth, in height, and in width.

SUMMARY OF THE INVENTION

To this end, the cartridge according to the invention includes the improvement whereby the grasping means comprise a flat member hinged about an axis lying at least approximately in the midplane of the connector, said flat member being suitable for occupying a first position against the box without substantially increasing the size thereof, and a second position away from the box in which said flat member may be grasped in order to exert an extraction force on the box acting substantially level with the connector.

Preferred features of the present invention are described below.

Preferably, the box is essentially rectangular in shape and the connector is disposed along one of its horizontal edges.

In a first basic embodiment, the flat member is constituted by a flap whose width is substantially equal to that of the box and whose height is slightly less, and pivoting connections about axes which are horizontal, for example, are provided between the flap and the side faces of the box in the vicinity of respective ends of the connector.

It is then advantageous for the flap to include a grasping zone including relief in at least one of its surfaces, and preferably in that one of its surfaces which is hidden when the flap is in the first position.

Preferably, a region of the front face of the box situated facing the flap when the flap is occupying said first position serves as a medium on which information is marked.

In this case, either the flap is transparent or else the outside face of the flap also serves as a medium on which information is marked.

In a second basic embodiment, the flat member is constituted by a generally U-shaped handle, and pivoting connections are provided between the free ends of the branches of the U-shape and the side faces of the box in the vicinity of responsive ends of the connector.

Structural details may be as follows:

each bearing includes outside surfaces having a cam profile which co-operates with a shoe-forming element fixed in said housing in such a manner that moving the flat member from its first position to its second position causes a thrust force to be exerted between the box and the equipment, thereby determining an initial stage of extraction;

said bearings and shafts embodying said axes are received in setbacks formed in the side faces of the box so as to avoid projecting beyond said side faces;

the flat member and the box include mutual resilient locking means for locking said flat member in said first position; and the flat member includes a notch providing a grasping zone for a fingernail or a tool in order to unlock said resilient locking means.

The invention also provides a box with at least one recess fitted with a connector, said recess closely receiving a cartridge as defined above.

Preferred features of the equipment are as follows:

mutual resilient locking means are provided between the box of the cartridge and at least one of the walls of the housing;

it includes a single housing which receives two cartridges side-by-side;

complementary guidance and positioning means are provided on the box of the cartridge and on the walls of the housing; and the guidance and positioning means comprise grooves provided at the corners of each cartridge box and complementary ribs formed on the walls of the housing, with some of said groves being common to two cartridges.

BRIEF DESCRIPTION OF THE DRAWINGS

Various embodiments of the invention are described by way of example with reference to the accompanying drawings, in which:

FIG. 1 is a perspective view of a cartridge in accordance with a first preferred embodiment of the invention, the cartridge being in front of a cartridge housing provided in an associated equipment;

FIG. 2 is a vertical cross-section through the FIG. 1 cartridge when in place in its housing;

FIG. 3 is a section view similar to FIG. 1 during cartridge extraction;

FIGS. 4a and 4b are section views showing a detail of a first variant embodiment of the invention;

FIG. 5 is a perspective view of a second variant embodiment of the invention; and FIG. 6 is a front view of a housing in an electronic equipment suitable for being fitted with two cartridges in accordance with the invention.

DESCRIPTION OF PREFERRED EMBODIMENTS

With reference initially to FIGS. 1 to 3, a cartridge 100 in accordance with a first aspect of the invention comprises firstly a box 101 which is essentially rectangular in shape and whose rear face is open in order to define a rearwardly directed cavity 102.

A printed circuit 104 is mounted vertically inside the cavity 102 and is held in place by screws or by snap-fastening means, for example, with an electronic memory unit 106, e.g. a programmable read only memory (PROM) in the form of a conventional dual in-line package being soldered thereto.

An elongate multipin connector 108 is also soldered to the printed circuit 104, and in the present example the connector is a female connector which is placed so as to extend essentially along the bottom edge of the box 100, parallel thereto.

The purpose of the connector 108 is to connect the memory 106 to a central unit (not shown) of an electronic equipment 200 such as a programmable automaton.

Thus, the memory 106 may be a so-called "system" memory which serves, on being changed, to switch from one type of programming instructions (language) or from one type of capability (set of available instructions) to another, or else it may be a so-called "program" memory containing a set of given instructions as programmed by the user.

In accordance with the present invention, a flap 110 is pivotally mounted to the bottom region of the box 100 and is provided, for this purpose with two end bearings 112 projecting substantially into an extension of the flat body of the flap. The bearings 112 receive horizontal shafts 114 which project from the bottom portions of the respective sides 116 of the box.

It may be observed that the flat body 110a of the flap is slightly smaller in height than the box 100 and that said box includes a step 118 in its front face slightly above the shafts 14 and 114'. Thus, when the flap is in its closed position, as explained in detail below, the bottom portion of the front face of the box is flush with the outside face 120 of the flap (FIG. 2).

FIG. 1 shows a housing 202 formed in the box 200 of an electronic equipment such as an automaton which is programmable for performing an industrial process, or the like. The housing 202 is of substantially the same size as the cartridge box 100, thereby enabling the cartridge to be received therein so that its front face is flush.

An opening 204 is formed in the back of the housing in order to allow the set of male pins 206 of a connector 208 to pass horizontally therethrough for engaging the connector in the cartridge. As can be seen in FIG. 2, the opening 204 may also receive the (rearwardly) projecting end of said female connector 108.

The cartridge shown in FIGS. 1 to 3 and the associated portion of the programmable automaton further include detailed arrangements as described below.

Firstly, there is an embossed zone 124 for making the flap easier to grasp in the fingers of the user for extraction purposes, as explained in detail below, said zone being provided substantially in the middle of the inside face 110a of the flat body of the flap. The embossing may be triangular in section.

Further, the top corners (top in the closed position) of said body 110a are provided with respective inwardly projecting locking lugs constituted by triangular portions 126 having spherical projections 128 on their outside surfaces. In association with these lugs, the top corners of the front face of the housing 100 are provided with respective rectangular openings 130 whose sides 132 have pairs of differently sloping ramps which constitute points of maximum resistance for the spherical projections 128 such that once passed they ensure that the flap 110 is locked in its closed position as shown in FIG. 2.

A notch 134 is provided substantially in the middle of the top edge of the flap 110 for co-operating with a fingernail to allow said flap to be released by unlocking the lugs 126.

Further, each of the top and bottom faces of the box 100 includes a flexible tongue 136 obtained by forming a pair of parallel slots 138 in the corresponding face and by reducing the thickness of the wall material in the tongue region.

The outside face of the free end of the tongue includes a latch 140 suitable for resiliently engaging behind an associated catch 142 provided in the corresponding face of the recess 202 of the associated equipment. This co-operation, together with the retaining effect produced by assembling the male and female connectors serves to lock the cartridge in the housing.

In addition, it may be observed that square section grooves 144 are formed in the four corners of the box 100 along the major portion of its depth and opening out at respective rear ends. These grooves 144 are intended to co-operate with corresponding square section ribs 146 (FIG. 1) formed in the four corners of the housing 202 for the purpose of guiding the box while it is being inserted into the housing or being extracted therefrom.

Further, when a plurality of boxes are disposed side-by-side in a common multiple-width housing, such ribs 146 serve, advantageously, to position each box correctly for ensuring that the male and female connectors are in a face-to-face relationship enabling them to be interconnected.

It may also be mentioned that setbacks 148 are provided on either side of the box 100 level with its shafts. These recesses serve to receive the shafts and the associated bearings, and prevent these items from projecting sideways beyond the walls of the box, thereby reducing overall size and making it possible to juxtapose a plurality of cartridges, where so desired, without wasting space.

Further, as can be seen in particular in FIG. 3, it may be observed that each of the flap bearings includes a flattened finger 150 which engages in an associated flat cavity 152 formed in one of the walls of the above-mentioned setback when the flap is open and in a determined angular position. As a result, the bearing is prevented from moving in translation along its shaft, and it is not possible to accidentally pull the bearings off their shafts by applying too much force to the flap 110.

Finally, the method of fixing the printed circuit 104 in the associated cavity 102 of the box may be observed: the circuit bears against four positioning studs 154 after being snap-fastened over four associated ramps 156, as can be seen clearly in FIG. 2.

Use of the above-described cartridge is explained below with reference, more particularly, to FIGS. 2 and 3.

In FIG. 2, the cartridge 100 is placed in its housing 202. It is held firmly firstly by the male and female connectors 208 and 108 engaging, and secondly by the locking action of the flexible top and bottom tongues 136.

When an operator seeks to extract the cartridge 100 from its housing 202, for example for the purpose of replacing it with another cartridge with different memory contents, the operator releases the flap 110 by putting a fingernail into the notch 134 (which only requires relatively little force); once released, the flap is brought to the position shown in FIG. 3, i.e. lying substantially in the horizontal engagement and separation plane of the connectors 108 and 208.

According to an essential characteristic of the invention, the shafts 114 by which the flap 110 is connected to the box 100 are situated substantially at the same level as the midplane P passing through the connectors 108 and 208.

Thus, when the operator pulls on the flap 110, advantageously by making use of the grasping zone 124 (arrow F), the force is applied substantially on the horizontal midline of the female connector 108, thereby enabling it to be separated from the male connector while applying a force whose orientation and position are optimum, and without any risk of twisting the pins 206 of the male connector.

It may be observed that during the initial stage of extraction, the locking tongues 136 disengage from the associated catches 142 simply by virtue of the extraction force directed along the arrow F.

When a cartridge in accordance with the invention is to be inserted in an available housing, it is merely put into position (with the male pins 208 beginning to penetrate after the box 100 has already been partially inserted into its housing), and suitable pressure is exerted on the bottom portion of the front face of the box so that the resulting force is exerted approximately in the horizontal midplane of the connectors. In this case, it is naturally possible for the flap 110 to be previously closed against the front face of the box.

However, it is also possible to plug in a cartridge when its flap is open and occupying approximately the position shown in FIG. 3. In this case, the insertion force is applied to the flap like the extraction force except in the opposite direction, and is thus guaranteed to act in the midplane of the connectors or very close thereto.

In either case, the corner ribs 146 and the associated grooves 144 provide optimum guidance for the cartridge throughout its movement.

Thus, the present invention provides a cartridge whose extraction means do not increase the size of the cartridge in width, in height, or in depth when the extraction means are in the storage position, said cartridge further not requiring any special arrangements in the housing for receiving the cartridge (other than the locking and guidance arrangements described above and applicable to all types of cartridge), which arrangements could increase the bulk of the installation. At the same time, a cartridge in accordance with the invention provides a grasping member for extraction purposes merely by the simple operation of opening the flap, with said member being practical to use by virtue of the large grasping area provided, and exerting the extraction force level with the connectors, thereby avoiding any jamming or warping thereof.

FIGS. 4a and 4b show a variant embodiment of a detail of the present invention. More precisely, in order to further facilitate cartridge extraction, the bearings holding the flap 110 in the box 100, now referenced 112', are designed to act while the flap is being pivoted to apply a force in the appropriate direction. It can thus be seen that the outside surface 113 of bearing 112' has an eccentric or cam profile which comes into contact with an element referenced 210 projecting from the back of the associated housing 202 and having a front end face which acts as a camming shoe for cooperating with the camming surface 113.

Thus, when the flap 110 is closed, it is dimensioned so that the cartridge 100 can be fully received in its housing, as shown in FIG. 4a.

However, as the flap 110 is opened for the purpose of being grasped so as to extract the cartridge, the local radius of the camming surface 113 increases, thereby exerting horizontal thrust between the shaft 114 of the box and the shoe-forming element 210, thus initiating cartridge extraction by displacement in the direction of arrow F'.

This further facilitates cartridge extraction.

It should be observed, both in the embodiment shown in FIGS. 1 to 3 and in its variant shown in FIGS. 4a and 4b, that in addition to providing an extraction function, the flap 110 may also advantageously serve as a protective cover for information on the front face of the box, e.g. in the form of an adhesive label or the like, serving to identify the contents of the ROM. This is particularly advantageous in the hostile industrial environments in which programmable automatons are often located. In such cases, the flap may be made of transparent plastic material so as to enable the information to be seen without moving the flap.

Another possible configuration consists in putting "manufacturer" information on the front face of the box, with the outside face of the flap being reserved for receiving "user" information.

FIG. 5 is a perspective view of another variant embodiment of the present invention. In this variant, items or parts which are identical or similar to those of the preceding embodiments are designated by the same reference numerals.

As can be seen, the flap 110 is replaced in this case by a handle 160 which is generally U-shaped, with the bearings 112 being provided at the free ends of the two branches 160b and 160c of the U-shape. The locking lugs 126 are retained, but the grasping zone of the embodiment of FIGS. 1 to 3 is replaced for the purposes of exerting a tractive force by the base 160a of the U-shape.

Although not shown, it is possible to shape the front face of the box 101 in this variant so that when the handle is folded down against the box, the front face of the box is flush with the handle. More precisely, an upsidedown U-shaped depression which is complementary to the handle is formed around the perimeter of the front face of the box.

FIG. 6 is a front view of a portion of a programmable automaton suitable for receiving two cartridges in accordance with the present invention.

To this end, the automaton includes a single housing 202 whose height and depth match the height and depth of the cartridges, and whose width is equal to twice the width of a cartridge.

Two openings 204 can be seen passing the pins 206 of two respective male connectors, and guide ribs 146 can also be seen. In this respect, single rectangular ribs 146' located in the middles of the top and bottom faces respectively of the housing may serve to guide and position both the left cartridge and the right cartridge.

Thus, as mentioned above, both cartridges in accordance with the invention may be closely juxtaposed (with the shafts 114 and the bearings 112 being situated in setbacks 148 so that they do not project beyond the side faces of the box), since use is made of the third dimension perpendicular to the front face of the automaton for the extraction means.

Preferably, the box 101 and its flap 110 or its handle 160 are made of molded plastic material, with the flap 110 being optionally transparent, as mentioned above.

Naturally, the present invention is not limited to the above-described embodiments shown in the drawings, and the person skilled in the art is capable of applying numerous variations or modifications within the scope of the invention.

I claim:

1. A removable memory cartridge for electronic equipment such as a programmable automaton, said cartridge being of the type comprising: a box, a memory unit mounted in said box, and an elongate connector fixed to said box and enabling said memory unit to be interconnected with electronic equipment, said connector mechanically fixing the cartridge in said electronic equipment, said box having grasping means to enable said cartridge to be extracted by separating the connector, the grasping means having a flat member hinged about an axis lying approximately in the midplane of the connector, said flat member occupying a first position against said box without substantially increasing the size thereof, and occupying a second position away from the box in which said flat member is graspable in order to exert an extraction force on the box acting substantially level with the connector.

2. A cartridge according to claim 1, wherein the box is essentially rectangular in shape and wherein the connector is disposed along one of its horizontal edges.

3. A cartridge according to claim 2, wherein the flat member is constituted by a flap whose width is substantially equal to that of the box and whose height is slightly smaller, with pivoting connections being provided between the flap and the side faces of the box in the vicinity of the respective ends of the connector.

4. A cartridge according to claim 3, wherein the flap includes a grasping zone on at least one of its faces, said zone including relief.

5. A cartridge according to claim 3, wherein a region of the front face of the box situated facing the flap when the flap is occupying said first position, serves as a medium on which information is marked.

6. A cartridge according to claim 5, wherein the flap is transparent.

7. A cartridge according to claim 5, wherein the outside face of the flap also serves as a medium on which information is marked.

8. A cartridge according to claim 2, wherein the flat member is constituted by a generally U-shaped handle with pivoting connections being provided between the free ends of the branches of the U-shape and the side faces of the box in the vicinity of respective ends of the connector.

9. A cartridge according to claim 3, wherein each pivoting connection comprises a bearing which includes an outside surface having a cam profile which cooperates with a shoe-forming element fixed in said housing in such a manner that moving the flat member from its first position to its second position causes a thrust force to be exerted between the box and the equipment, thereby determining an initial stage of extraction.

10. A cartridge according to claim 3, wherein said pivoting connections comprises bearings and said axes are formed by shafts, said bearing and said shafts being received in setbacks formed in the side faces of the box so as to avoid projecting beyond said side faces.

11. A cartridge according to claim 1, wherein the flat member and the box include mutual resilient locking means for locking said flat member in said first position.

12. A cartridge according to claim 11, wherein the flat member includes a notch providing a grasping zone for a fingernail or a tool in order to unlock said resilient locking means.

13. Electronic equipment such as a programmable automaton, including a box with at least one recess fitted with a connector, said recess closely receiving a removable cartridge, said cartridge including a removable memory cartridge for electronic equipment such as a programmable automaton, the cartridge being of the type comprising a box, a memory unit mounted in the box, and an elongate connector fixed to the box and enabling said memory unit to be interconnected with electronic equipment, said connector being the sole means for mechanically fixing the cartridge in said housing, the box being provided with grasping means to enable the cartridge to be extracted by separating the connector, the cartridge including the improvement whereby the grasping means comprise a flat member hinged about an axis lying at least approximately in the midplane of the connector, said flat member being suitable for occupying a first position against the box without substantially increasing the size thereof, and a second position away from the box in which said flat member may be grasped in order to exert an extraction force on the box acting substantially level with the connector.

14. Electronic equipment according to claim 13, wherein mutual resilient locking means are provided between the box of the cartridge and at least one of the walls of the housing 15. Electronic equipment according to claim 13, including a single housing which receives two cartridges side-by-side.

16. Electronic equipment according to claim 15, wherein complementary guidance and positioning means are provided on the box of the cartridge and on the walls of the housing.

17. Electronic equipment according to claim 16, wherein the guidance and positioning means comprise grooves provided at the corners of each cartridge box and complementary ribs formed on the walls of the housing, with some of said grooves being common to two cartridges.

* * * * *